United States Patent
Bailey et al.

(10) Patent No.: US 8,516,304 B2
(45) Date of Patent: Aug. 20, 2013

(54) INTEGRATED CIRCUIT INCLUDING A PROGRAMMABLE LOGIC ANALYZER WITH ENHANCED ANALYZING AND DEBUGGING CAPABILITIES AND A METHOD THEREFOR

(75) Inventors: James Ray Bailey, Georgetown, KY (US); Christopher Wilson Case, Georgetown, KY (US); James Patrick Sharpe, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 191 days.

(21) Appl. No.: 12/877,846

(22) Filed: Sep. 8, 2010

(65) Prior Publication Data

US 2011/0047427 A1    Feb. 24, 2011

Related U.S. Application Data

(63) Continuation-in-part of application No. 12/542,976, filed on Aug. 18, 2009.

(51) Int. Cl.
*G06F 11/00* (2006.01)

(52) U.S. Cl.
USPC .................... 714/30; 714/39; 714/25

(58) Field of Classification Search
USPC ............................... 714/30, 25, 48
See application file for complete search history.

(56) References Cited

U.S. PATENT DOCUMENTS

| | | | |
|---|---|---|---|
| 5,954,830 A | 9/1999 | Ternullo, Jr. | |
| 6,016,563 A | 1/2000 | Fleisher | |
| 6,389,558 B1 | 5/2002 | Herrmann et al. | |
| 6,460,148 B2 | 10/2002 | Veenstra et al. | |
| 6,523,136 B1 | 2/2003 | Higashida | |
| 6,633,838 B1 | 10/2003 | Arimilli et al. | |
| 6,704,889 B2 | 3/2004 | Veenstra et al. | |
| 6,791,352 B2 | 9/2004 | Verdoorn et al. | |
| 7,240,303 B1 | 7/2007 | Schubert et al. | |
| 7,332,929 B1 | 2/2008 | Normoyle et al. | |
| 7,350,121 B2 | 3/2008 | Creigh | |
| 7,493,247 B2 | 2/2009 | Memmi | |
| 7,506,286 B2 | 3/2009 | Beardslee et al. | |
| 7,650,545 B1 | 1/2010 | Abramovici et al. | |
| 7,669,096 B2 | 2/2010 | Agarwal | |
| 2004/0003332 A1* | 1/2004 | Kim et al. | 714/744 |
| 2004/0216061 A1* | 10/2004 | Floyd et al. | 716/4 |

(Continued)

OTHER PUBLICATIONS

M. Abramovici et al., "A Reconfigurable Design-for-Debug Infrastructure for SoCs," Design Automation Conference 2006, Jul. 24-28, 2006, pp. 7-12.

(Continued)

*Primary Examiner* — Sarai Butler
(74) *Attorney, Agent, or Firm* — William F. Esser

(57) ABSTRACT

An integrated circuit including a logic analyzer with enhanced analyzing and debugging capabilities and a method therefore. In one embodiment, an integrated circuit includes a logic analyzer having a first input receiving a plurality of signals and an output for providing an indication of a detection, by the logic analyzer, of at least one trigger event; and a built in self test block having a first input for receiving one or more of the signals appearing at the first input of the logic analyzer, a second input coupled to the output of the logic analyzer for selectively enabling the BIST block, the BIST block generating and maintaining a signature based upon the first and second inputs thereof.

21 Claims, 13 Drawing Sheets

(56) References Cited

U.S. PATENT DOCUMENTS

| | | |
|---|---|---|
| 2008/0092003 A1 | 4/2008 | Khoche et al. |
| 2011/0047423 A1 | 2/2011 | Bailey |
| 2011/0047424 A1 | 2/2011 | Bailey |

OTHER PUBLICATIONS

J. Bailey et al., "Embedded Logic Analyzers for On-Line System Analysis," Proceedings on the International Conference on Information Systems Analysis & Synthesis, 2002.

B. Quinton et al., "Programmable Logic Core Based Post-Silicon Debug for SoCs," slides from the 4th IEEE Silicon Debug and Diagnosis Workshop, May 2007.

B. Quinton et al., "Programmable Logic Core Based Post-Silicon Debug for SoCs," 4th IEEE Silicon Debug and Diagnosis Workshop, May 2007.

International Search Report and Written Opinion of the International Searching Authority for PCT application, PCT/US11/50761, Jan. 26, 2012.

U.S Patent and Trademark Office, Office Action for patent U.S. Appl. No. 12/542,976 dated Nov. 28, 2011.

U.S Patent and Trademark Office, Office Action for patent U.S. Appl. No. 12/877,819 dated Dec. 12, 2011.

U.S Patent and Trademark Office, Office Action for patent U.S. Appl. No. 12/877,819 dated Sep. 4, 2012.

Non-final Office Action for U.S. Appl. No. 12/877,819, dated Jun. 28, 2013.

\* cited by examiner

INTEGRATED CIRCUIT INCLUDING A PROGRAMMABLE LOGIC ANALYZER WITH ENHANCED ANALYZING AND DEBUGGING CAPABILITIES AND A METHOD THEREFOR

CROSS REFERENCE TO RELATED APPLICATION

Pursuant to 37 C.F.R. §1.78, this application is a continuation-in-part application and claims the benefit of the earlier filing date of application Ser. No. 12/542,976, filed Aug. 18, 2009, entitled "An Integrated Circuit Including a Programmable Logic Analyzer with Enhanced Analyzing and Debugging Capabilities and a Method Therefor," the content of which is hereby incorporated by reference in its entirety.

BACKGROUND

1. Field of the Invention

The present invention relates generally to an embedded logic analyzer, and particularly to a programmable embedded logic analyzer for analyzing an electronic circuit.

2. Description of the Related Art

A logic analyzer is an electronic instrument that is used to capture and display data signals of an electronic circuit. Generally, the logic analyzer captures the data signals that are too fast to be observed by a user. The user observes the data signals captured by the logic analyzer to effectively analyze the electronic circuit and to take preemptive actions or to debug based on the analysis.

Logic Analyzers may be broadly classified as external logic analyzers and embedded logic analyzers. The embedded logic analyzer is generally included within a programmable logic device or an integrated circuit (IC), e.g., a complex programmable logic device (CPLD), field programmable gate array (FPGA), application specific integrated circuit (ASIC), etc. The embedded logic analyzer has the ability to capture large amounts of high speed data signals within the IC.

The embedded logic analyzer may include a memory to store the captured data signals. Usually, the embedded logic analyzer is programmable to capture and store the data signals specified by the user. The data signals stored by the embedded logic analyzer may be transferred to a computer for further analysis. The data signals are generally transferred to the computer through an interface provided on the IC.

FIG. 1 is a block diagram of a conventional embedded logic analyzer (ELA) 100 included within an integrated circuit (not shown). The ELA 100 includes an interconnect module 110 to receive a plurality of data signals within the integrated circuit. The interconnect module 110 is programmable to select a plurality of signals to be sampled and at least one trigger signal to enable sampling from the plurality of received signals. The at least one trigger signal is transferred to a trigger module 120. The trigger module 120 is programmable to set a trigger condition and to detect if the at least one trigger signal satisfies the trigger condition. If the trigger condition is satisfied, the trigger module 120 initiates a sampling process. Upon the initiation of the sampling process, a memory controller 130 starts sampling the plurality of signals to be sampled from the interconnect module 110. The sampled signals may be stored in a memory 140 for further analysis. Therefore, the ELA 100 operates to execute a general code given below:

IF (<TRIGGER CONDITION>) THEN (SAMPLE SIGNALS(X)), wherein the TRIGGER CONDITION is any logical operation or a series of logical operations and the SIGNALS (X) are the plurality of signals to be sampled from the interconnect module 110. According to the code executed by the ELA 100, when the trigger condition is satisfied, the ELA 100 samples at least one sampled signal and stores the sampled signal in the memory 140.

However, the ELA is unable to execute an action other than sampling when the trigger condition is satisfied. Further, conventional ELAs do not capture, analyze, and/or debug software data or firmware data signals within the IC, and additional instrument(s) may be necessary in order to analyze these types of data. Additionally, in order to program the ELA or to analyze the data stored within the ELA, the user is required to be present at a workstation where the ELA is installed.

It would be desirable therefore to provide an ELA with enhanced analyzing and debugging capabilities to obviate the above-mentioned problems.

SUMMARY

Exemplary embodiments of the present disclosure overcome the shortcomings in known logic analyzers and thereby satisfy a significant need for a mechanism for effectively testing and debugging a system. In accordance with an exemplary embodiment, there is disclosed an integrated circuit communicatively coupled within a system, the integrated circuit including a logic analyzer having an input receiving a plurality of signals and an output for providing an indication of the detection, by the logic analyzer, of at least one trigger event relative to at least one of the received signals. The integrated circuit further includes a built in self test (BIST) block having a first input for receiving one or more of the signals appearing at the input of the logic analyzer, and a second input coupled to the output of the logic analyzer for selectively enabling the BIST block. The BIST block generates and maintains a signature therein based upon the first and second inputs of the BIST block. By maintaining a generated signature based upon the one or more signals appearing at the input of the logic analyzer and providing the generated signature thereto for event triggering or sampling and storage therein, the logic analyzer is able to more effectively test and debug the system.

Additional features and advantages will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description of the present embodiments of the invention and are intended to provide an overview or framework for understanding the nature and character of the invention as it is claimed. The accompanying drawings are included to provide a further understanding of the invention and are incorporated into and constitute a part of this specification. The drawings illustrate various embodiments of the invention and together with the description serve to explain the principles and operation of the invention.

BRIEF DESCRIPTION OF THE DRAWINGS

The above-mentioned and other features and advantages of the various embodiments, and the manner of attaining them, will become more apparent will be better understood by reference to the accompanying drawings, wherein.

DETAILED DESCRIPTION

Figure 1:
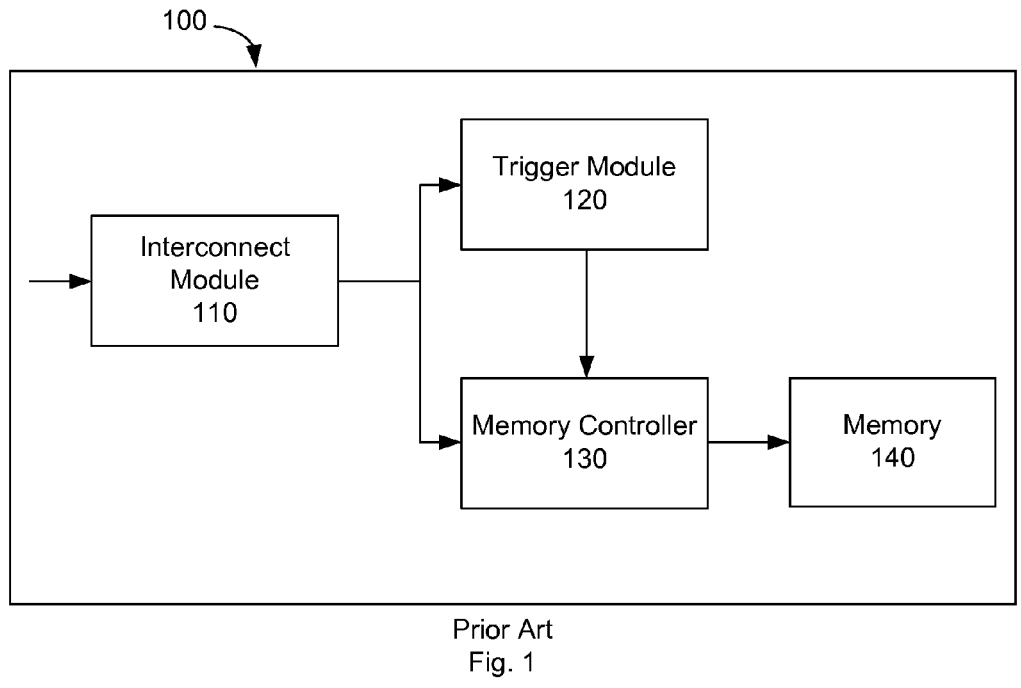
FIG. 1 is a block diagram of a conventional embedded logic analyzer.

Reference will now be made in detail to the exemplary embodiment(s) of the invention, as illustrated in the accompanying drawings. Whenever possible, the same reference numerals will be used throughout the drawings to refer to the same or like parts.

Figure 2:
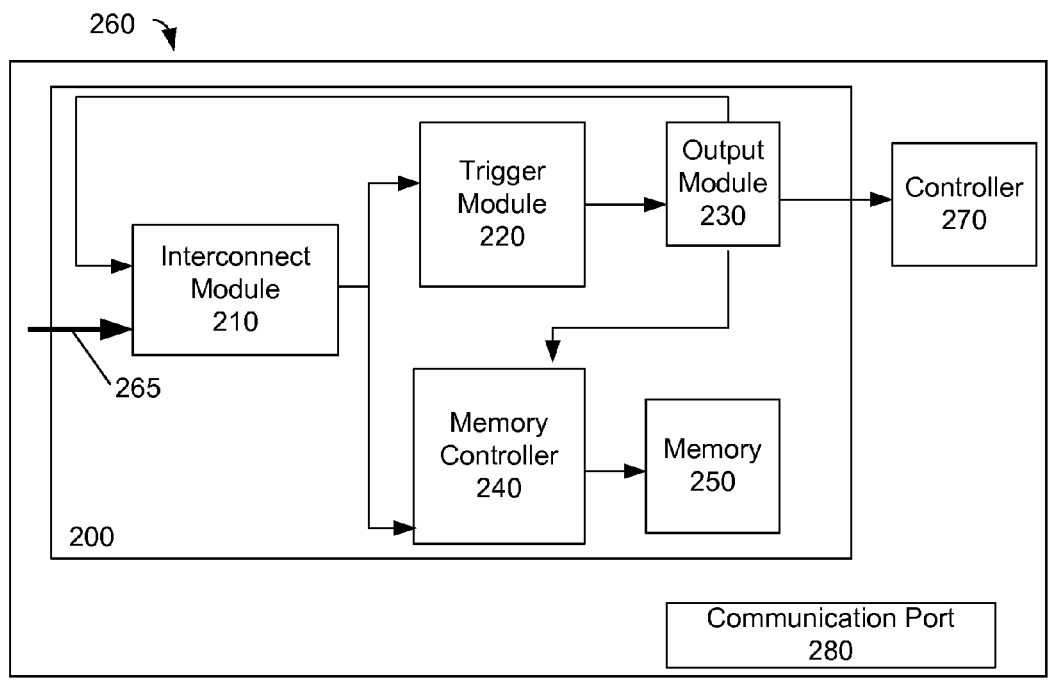
FIG. 2 is a block diagram of one embodiment of an integrated circuit including a logic analyzer.

The present invention is directed to a programmable embedded logic analyzer included within an integrated circuit having enhanced analyzing and debugging capabilities. FIG. 2 illustrates one embodiment of an embedded logic analyzer (ELA) 200 disposed on an integrated circuit (IC) 260. The ELA 200 includes an interconnect module 210 that is programmable to select at least one of a plurality of candidate signals within the IC 260. The plurality of candidate signals selected by the interconnect module 210 may include at least one trigger signal and/or at least one signal to be sampled (i.e., a sampled signal). The interconnect module 210 routes the at least one trigger signal to a trigger module 220. The trigger module 220 detects if the at least one trigger signal satisfies at least one trigger condition specified by a user. If the trigger condition is satisfied, an output module 230 performs at least one task. For example, the output module 230 may modify at least one signal within the IC 260.

The IC 260 includes a plurality of buses 265 that carry the plurality of candidate signals. The plurality of signals includes at least one sampled signal and at least one trigger signal. The interconnect module 210 receives the plurality of signals from the plurality of buses 265. The interconnect module 210 is programmable to select at least one sampled signal and/or at least one trigger signal from the plurality of received signals. Essentially, the interconnect module 210 selects the sampled signal(s) and/or trigger signal(s) specified by a user. In one embodiment, the interconnect module 210 may be a multiplexer.

The interconnect module 210 routes the trigger signal to the trigger module 220. The trigger module 220 is programmable to set the trigger condition. The trigger condition may be a single logical operation (e.g., a simple event) or a series of logical operations (e.g., a complex series of events performed by a finite state machine). The trigger module 220 detects if the at least one trigger condition is satisfied by the trigger signal. If the trigger condition is satisfied, the trigger module 220 provides information to the output module 230.

The output module 230 performs at least one task from a group of tasks based upon, in response to, or as a result of the satisfaction of the at least one trigger condition. The group of tasks may include modifying at least one signal from the plurality of received signals, modifying the at least one trigger condition, and initiating a sampling process. In one embodiment, the output module 230 is a field programmable gate array.

If the output module 230 initiates the sampling process, a sampling controller 240 starts sampling the sampled signal from the interconnect module 210. The sampled signal sampled by the sampling controller 240 may be stored in a memory 250. The signals stored in a memory 250 may be transferred to a computer (not shown) for analysis. Such signal transfer to the computer may occur through a communication port 280 such as a USB port. The signals transferred to the computer may then be analyzed by the user.

Figure 3:
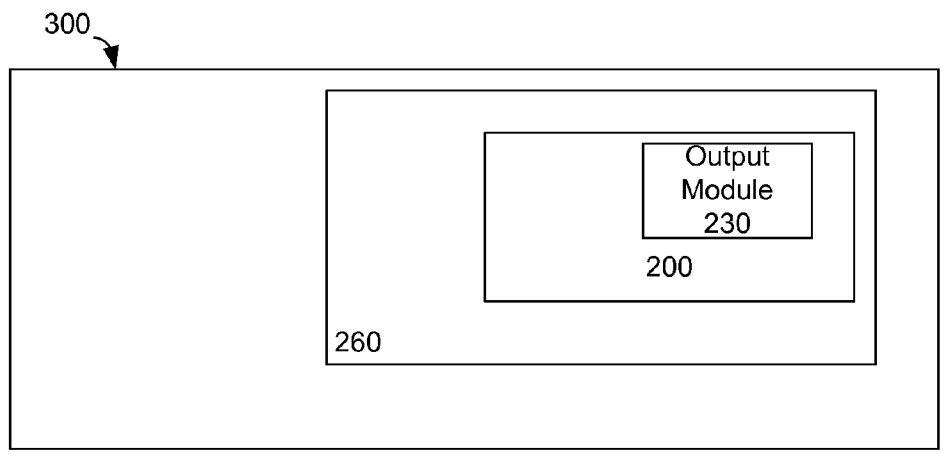
FIG. 3 is a block diagram of an apparatus embedding the integrated circuit of FIG. 2.

While FIG. 2 shows that the memory 250 resides in the ELA 200, it will be appreciated by one of ordinary skill in the art that the memory may be a separate component on the integrated circuit 260 in another embodiment. In yet another embodiment, the memory may be located separately from the integrated circuit 260, provided that it remains communicatively coupled to the ELA. After analyzing the signals, at least one action within an apparatus 300 embedding the IC 260, as shown in FIG. 3, may be performed by configuring or programming the output module 230 to perform a specific task based upon the analysis. For example, the user may debug an error or fault or correct the action of a component of the apparatus 300. Therefore, the apparatus 300 can be diagnosed more effectively to ensure proper functioning of the apparatus 300. In one embodiment, the apparatus 300 may be an imaging device such as a printer, a scanner, or a multi-function device which has the ability to print, scan, fax and/or copy.

The output module 230 may be programmed or configured to modify at least one signal based upon, in response to, or as a result of the satisfied trigger condition. If the satisfied trigger condition indicates an error, the output module 230 may modify at least one signal from the plurality of signals received by the ELA 200 to correct the indicated error. For example, if a value of signal 'X' has to be 30 for error-free operation of the apparatus 300, and if the trigger condition X≠30 is satisfied, the output module 230 modifies the value of signal X to bring the value of the signal to 30 for error free operation of the apparatus 300.

The output module 230 may also instruct a controller 270 (shown in FIG. 2) to modify at least one signal from the plurality of signals received by the ELA 200 to correct the indicated error. For example, the output module 230 may instruct the controller 270 to turn off a pulse width modulator (PWM) if the PWM that regulates the speed of a motor is detected to be stuck, thereby preventing damage to the motor. The output module 230 may also be capable of stopping a direct memory access (DMA) operation. In addition, the output module 230 may modify the trigger condition, if required. These capabilities of the output module 230 greatly enhance the debugging power of the ELA 200. Therefore, the ELA 200 generally executes a code given below:

IF (<CONDITION>) THEN (<ACTION(S)>), wherein ACTION(S) is at least any one of the above mentioned actions performed by the output module or the controller, and CONDITION is the trigger condition set by the user.

Figure 4:
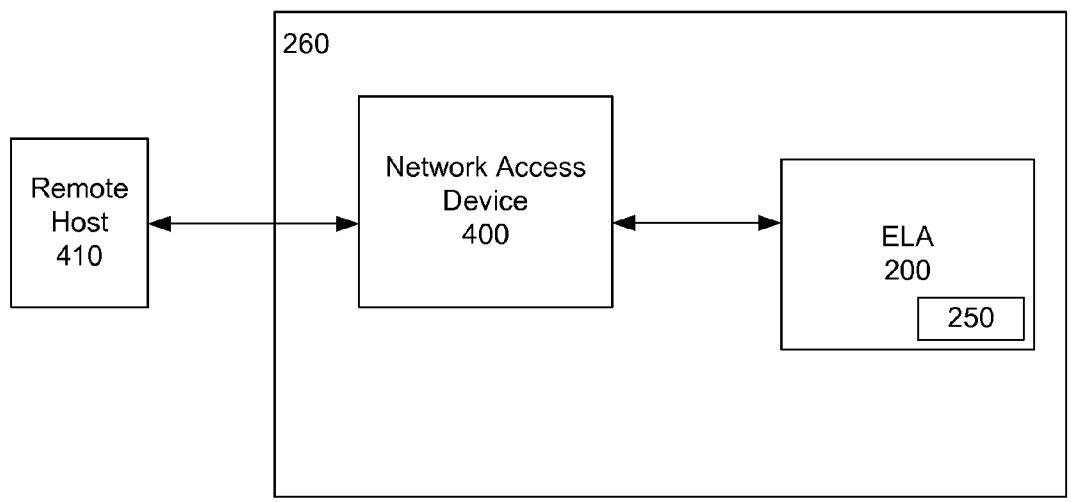
FIG. 4 is a block diagram illustrating a network access device coupling a remote host to the integrated circuit of FIG. 2.

In one embodiment, as shown in FIG. 4, the IC 260 includes a network access device 400. The network access device 400 is communicatively coupled to the ELA 200 and is connected to a remote host 410 directly or through a network. The connection may include a wired connection and/or a wireless connection, and the network may be the Internet, a local area network, a wide area network or a metropolitan area network. The remote host 410 is capable of programming the ELA 200 within the IC 260. The remote host 410 is also capable of analyzing the sampled signals stored in memory. The remote host 410 accesses the ELA 200 through the network access device 400.

The ELA 200 may be programmed to automatically and periodically send the stored sampled signals to the remote host 410 for analysis. For example, the ELA 200 embedded within a printer may be programmed to automatically and periodically send an encoder signal to the remote host 410. The encoder signal indicates the motion of the motor within the printer. If it is determined that the encoder signals are decaying or going into a bad state, a remote user may provide instruction to service the printer. In one embodiment, the ELA 200 is programmable to transfer stored data signals to the remote host 410 if such instruction or command is received from the remote host 410.

Figure 5:
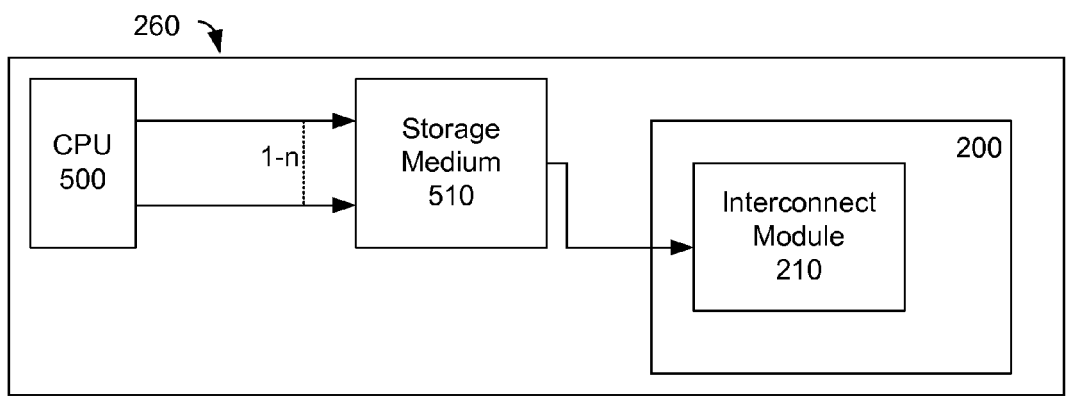
FIG. 5 is a block diagram illustrating an interface to supply soft signals to the logic analyzer included on the integrated circuit of FIG. 2.

In another embodiment, as illustrated in FIG. 5, the IC 260 includes a central processing unit (CPU) 500. The CPU 500 provides a plurality of data signals to the ELA 200. The data signals may be hardware, software or firmware signals. The data signals are supplied from the CPU 500 to the ELA 200 through an interface. The interface is communicatively coupled to the CPU 500 and the ELA 200. The interface includes a storage medium 510 and a plurality of communication lines (1-*n*). The plurality of communication lines are communicatively coupled with the CPU 500 and the storage medium 510. The plurality of communication lines (1-*n*) are configured to supply the plurality of data signals from the CPU 500 to the storage medium 510. The storage medium 510 is configured to store the plurality of data signals.

Each data signal from the plurality of data signals is associated with a data field and an address field. The data field provides the value of the data signal to be stored and the address field specifies a location in the storage medium 510 where the data signal is stored. The storage medium 510 includes a plurality of memory locations. Each of the plurality of memory locations has a unique address. The plurality of data signals stored in the storage medium 510 is supplied to the interconnect module 210 through the plurality of buses on the IC 260. Essentially, the storage medium 510 is in electrical communication with the plurality of buses on the IC 260 to supply the stored data signals to the interconnect module 210.

The stored data signals supplied to the interconnect module 210 includes the hardware, software and/or firmware data signals. The data signals include a plurality of sampled signals and at least one trigger signal. The interconnect module 210 selects the plurality of sampled signals and at least one trigger signal from the plurality of received data signals. The trigger signal is supplied to the trigger module 220. The trigger module 220 detects if the trigger signal satisfies at least one trigger condition. If the trigger condition is satisfied, the sampling controller 240 samples the plurality of sampled signals from the interconnect module 210. The plurality of sampled signals is stored in the memory 250. The plurality of stored signals along with other stored signals is transferred to the computer for analysis. Therefore, the software, hardware and/or firmware signals can be analyzed simultaneously on the computer.

Figure 6:
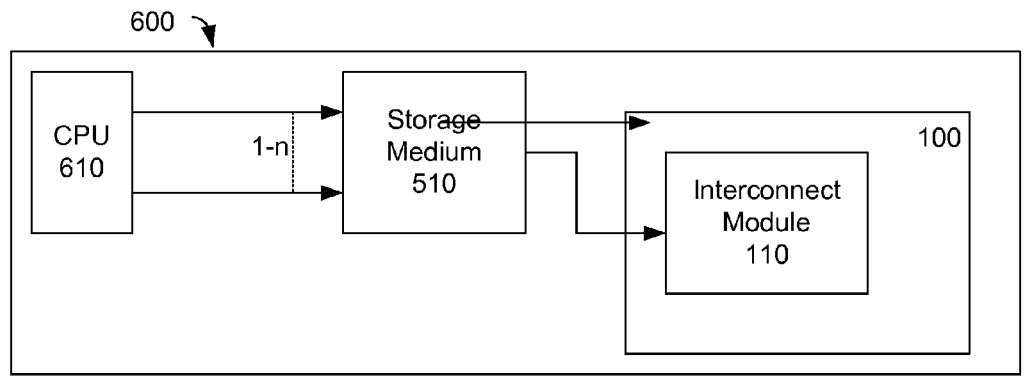
FIG. 6 is a block diagram illustrating an interface configured to supply soft signals to the logic analyzer of FIG. 1 according to the present invention.

In another embodiment, as illustrated in FIG. 6, the interface i.e., the plurality of communication lines (1-*n*) and the storage medium 510 are disposed on an IC 600. The IC 600 includes the ELA 100 of FIG. 1 and a CPU 610. The CPU 610 supplies the plurality of data signals to the ELA 100. The plurality of data signals includes at least one software or firmware data signal. The plurality of data signals are supplied from the CPU 610 to the ELA 100 through the plurality of communication lines (1-*n*) and the storage medium 510. The plurality of communication lines (1-*n*) is configured to supply the plurality of data signals from the CPU 610 to the storage medium 510. The storage medium 510 is configured to store the plurality of data signals. The data signals stored in the storage medium 510 are supplied to the interconnect module 110 through the plurality of buses on the IC 600. Essentially, the storage medium 510 is in electrical communication with the plurality of buses on the IC 600 to supply the stored data signals to the interconnect module 110.

Figure 7:
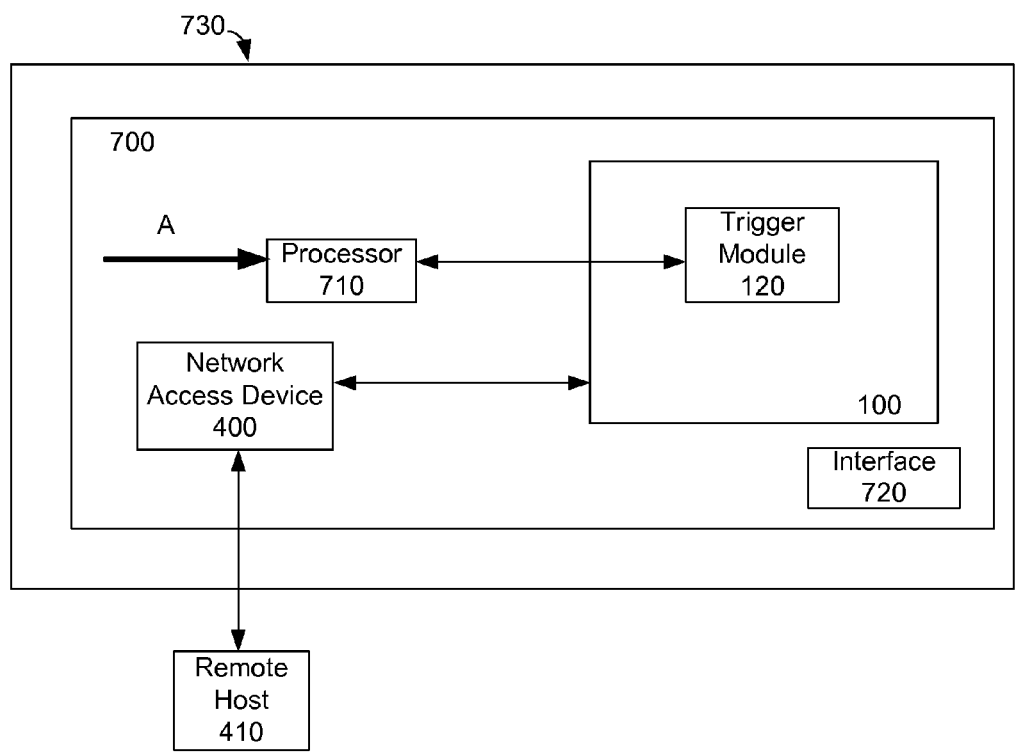
FIG. 7 is a block diagram showing a processor in communication with the logic analyzer included within the integrated circuit of FIG. 2.

In yet another embodiment, as illustrated in FIG. 7, the ELA 100 is disposed on an IC 700 that includes a processor 710. The processor 710 receives a plurality of signals from a plurality of buses on the IC 700. Such signals may be any combination of hardware, software and/or firmware signals (indicated by arrow A) within the IC 700. The processor 710 is communicatively coupled to the ELA 100 disposed on the IC 700. More specifically, processor 710 may be communicatively coupled to the trigger module 120 of the ELA 100.

In an alternate embodiment, the IC 700 may be communicatively coupled to the ELA 200 of FIG. 2. In this embodiment, the processor 710 receives at least one trigger signal from the trigger module 220 to detect if at least one trigger condition is satisfied. If at least one trigger condition is satisfied, the processor 710 modifies at least one signal from the plurality of data signals received by the processor 710. The processor 710 is also programmable to modify at least one trigger condition in the trigger module 220 when the at least one trigger condition is satisfied. The processor 710 is programmable through an interface 720 provided on the IC 700.

The IC 700 may include the network access device 400. The network access device 400 communicatively couples the IC 700 to the remote host 410. The remote host 410 can program the ELA 100 disposed on the IC 700. The remote host 410 can also analyze the sampled signals stored in the ELA 100. Therefore, the remote host 410 can diagnose an apparatus 730 embedding the ELA 100 and the network access device 400.

Figure 8:
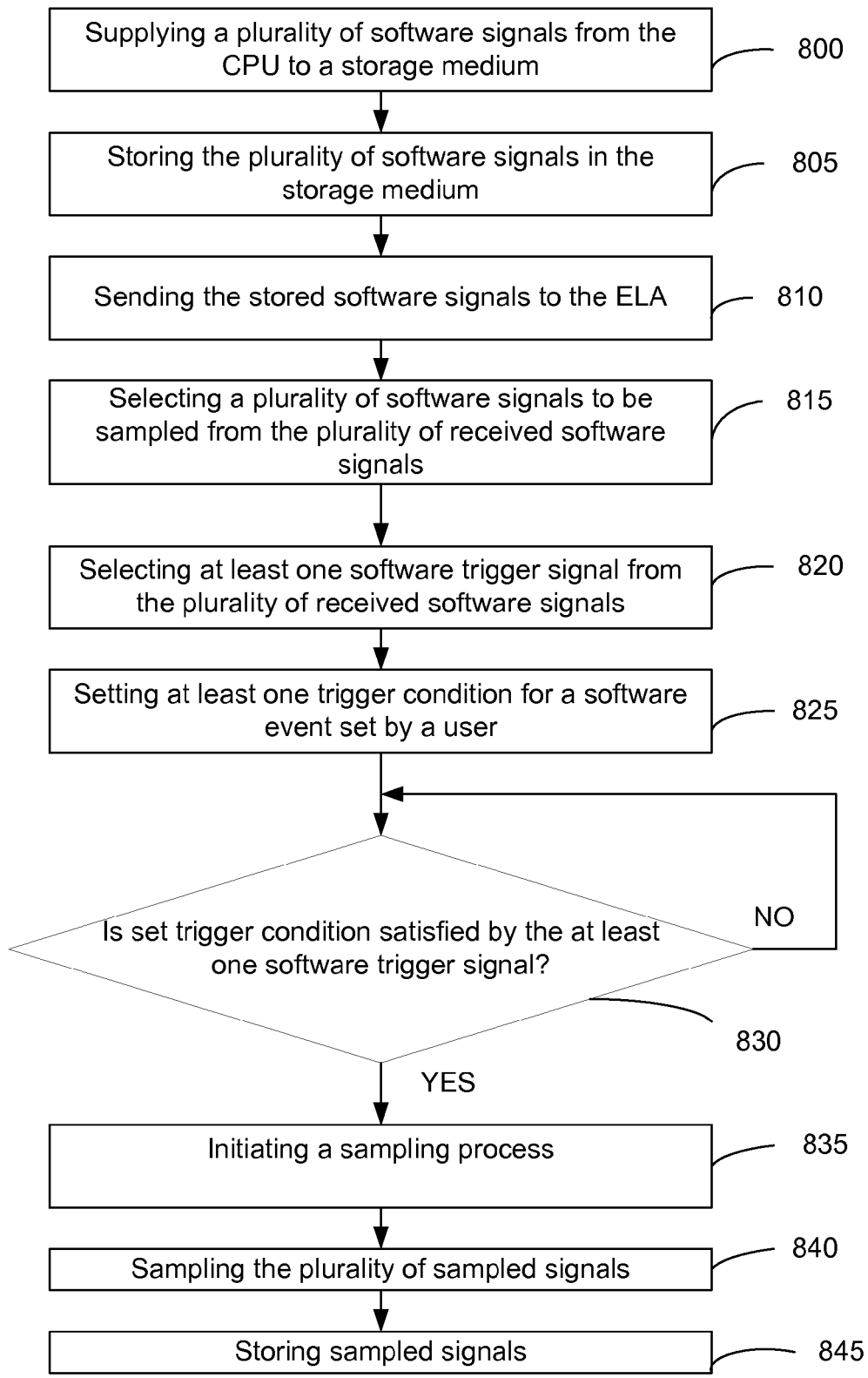
FIG. 8 is a flow chart illustrating the actions performed to capture software signals within the integrated circuit of FIG. 2.

FIG. 8 is a flowchart illustrating a method for capturing software signals or events within the IC 260. The CPU 500 disposed on the IC 260 supplies a plurality of software signals to the storage medium 510 at block 800. The storage medium is configured to store the plurality of software signals (block 805). The storage medium 510 sends the stored software signals to the interconnect module 210 of ELA 200 at block 810. The interconnect module 210 is programmed to select a plurality of software signals that is to be sampled from the plurality of received software signals (block 815). The interconnect module 210 is also programmed to select at least one software trigger signal from the plurality of received software signals (block 820). The user sets within the trigger module 220 at least one trigger condition for a software event (block 825). The trigger module 220 detects if the set trigger condition is satisfied by the at least one software trigger signal (block 830). If the trigger condition is satisfied, the trigger module 220 initiates the sampling process at block 835. Otherwise, the trigger module repeats the detection of a satisfied set trigger condition.

Upon the initiation of the sampling process, the sampling controller 240 samples the plurality of software signals that is to be sampled from the interconnect module 210 (block 840). The sampled software signals may then be stored in the memory 250 at block 845. The stored software signals may also be transferred to the computer for analysis by a program running on the computer or by a user.

It will be appreciated by one of ordinary skill in the art the present invention is not limited to software signals. Rather other signals, such as hardware and firmware, may be captured instead of and/or in combination with software signals.

Figure 9:
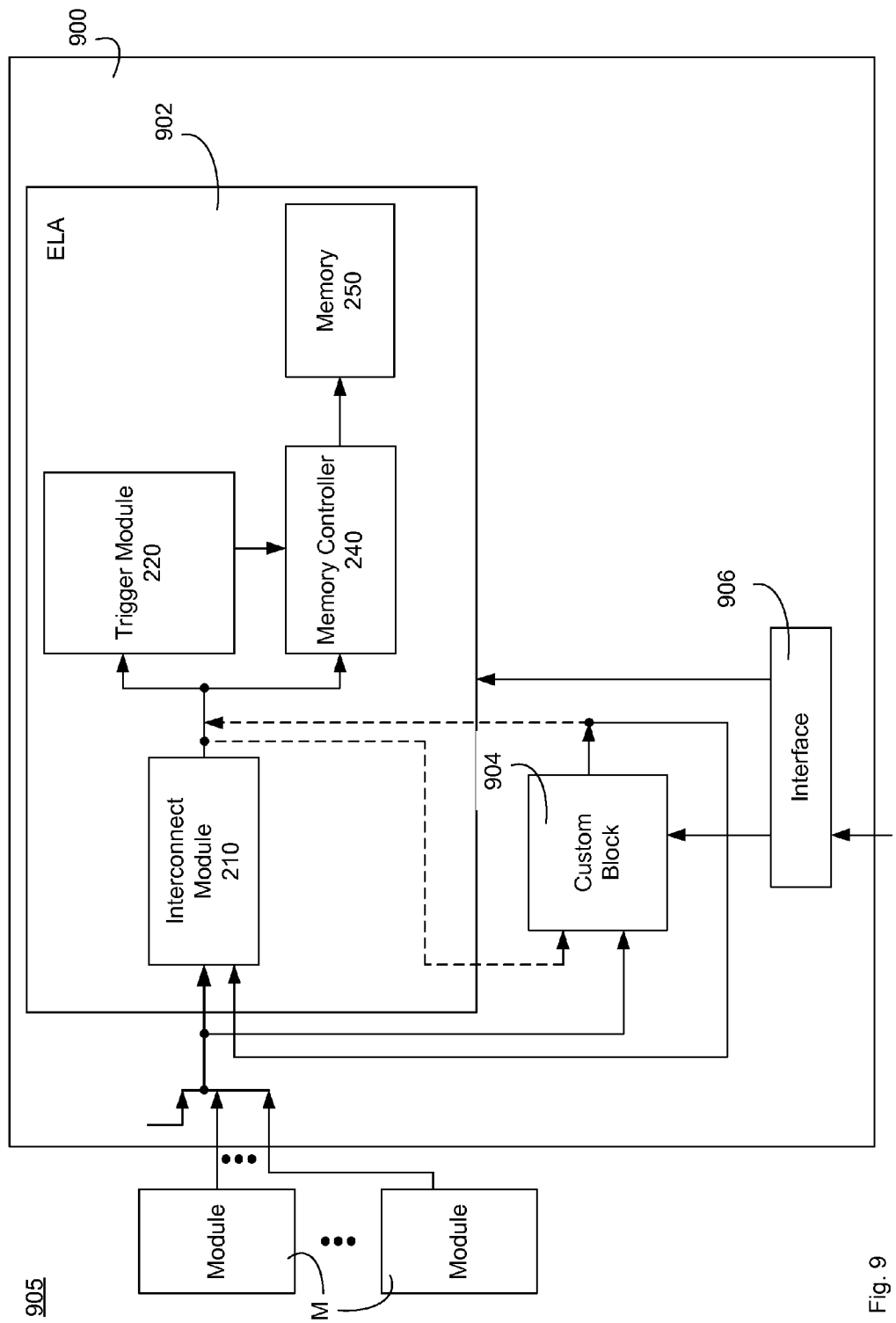
FIG. 9 is a block diagram illustrating a system having an integrated circuit according to an exemplary embodiment.

FIG. 9 illustrates a system integrated circuit 900 according to another embodiment of the present invention. Integrated circuit 900 may be disposed in a system 905 having a plurality of modules M. Integrated circuit 900 may include an embedded logic analyzer 902 having an interconnect module 210, trigger module 220, memory controller 240 and memory 250 as described above. Embedded logic analyzer 902 may be coupled with the system modules M so that embedded logic analyzer 902 may be used to effectively test or debug system 905 in which it is disposed.

It is further understood that the phrases "test" and "debug" are intended to include those operations typically performed during development, testing, debugging, system analysis and in-field monitoring and servicing of the system and its system modules M, and is not intended to be limited to only one phase or time period of system activity from design through the usable life of the system.

Integrated circuit 900 may also include a custom block 904 which receives one or more signals associated with embedded logic analyzer 902. In particular, custom block 904 may receive as an input one or more signals provided to embedded logic analyzer 902 from the other modules M of the system. Such signals may include signals that are available for sampling or event triggering by embedded logic analyzer 902. Custom block 904 may generate at its output one or more output signals that are based upon the one or more received input signals and which are fed back into embedded logic analyzer 902 for sampling or triggering. By providing to embedded logic analyzer 902 one or more additional signals for sampling and/or event triggering that is based upon signals associated with embedded logic analyzer 902, embedded logic analyzer 902 may more efficiently debug a system in which integrated circuit 900 is disposed.

Custom block 904 may include circuitry that is specific to the particular system and/or system modules M which are available for test and/or debug using embedded logic analyzer 902. In an exemplary embodiment of the present invention, custom block 904 is configurable so that the signals generated thereby may be configurable. Having custom block 904 configurable advantageously allows for substantial flexibility for testing and/or debugging a wide variety of system modules M and system signals generated thereby. Custom block 904 may be implemented as a FPGA or CPLD. Alternatively, custom block 904 may be implemented with a processor having memory coupled thereto for storing code for execution by the processor. By having the memory accessible for loading different code, custom block 904 may provide sufficient flexibility to test and/or debug a substantially large number of different system modules M. In yet another alternative, custom block 904 may include state machine circuitry that is programmable in part by programming and/or storing information into registers that are located in or associated with the state machine. It is understood that custom block 904 may be implemented in any number of ways to provide configurable functionality and signal generation.

As shown in FIG. 9, custom block 904 may receive one or more signals that are provided to embedded logic analyzer 902. Such signals provided to embedded logic analyzer 902 may be received by custom block 904 by directly coupling one or more inputs of custom block 904 to one or more inputs of embedded logic analyzer 902. In addition or in the alternative, such signals provided to embedded logic analyzer may be received by custom block 904 by directly coupling one or more inputs of custom block 904 to one or more outputs of interconnect module 210 that are to trigger an event and/or to be sampled, as shown in dotted lines in FIG. 9. As further shown in FIG. 9, the output of custom block 904 may provide to embedded logic analyzer 902 one or more output signals for event triggering or sampling. Such one or more output signals may be provided to embedded logic analyzer 902 by directly coupling the output of custom block 904 to an input of embedded logic analyzer 902. In addition or in the alternative, such one or more output signals may be provided to embedded logic analyzer 902 by directly coupling the output of custom block 904 to an input of trigger module 220 and/or an input of memory controller 240, as shown in dotted lines in FIG. 9.

Integrated circuit 900 may further include an interface 906 which may be used for accessing custom block 904 and embedded logic analyzer 902. In particular, interface 906 may provide a wired or wireless connection with a network device on a network, such as a remote host (not shown). Interface 906 may provide the necessary interface between the network device and various blocks in integrated circuit 900, including embedded logic analyzer 902 and custom block 904. Embedded logic analyzer 902, and particularly interconnect module 210 and trigger module 220, may be controlled, configured and/or programmed using interface 906. In addition, the data sampled by embedded logic analyzer 902 may be downloaded to a network device for analysis via interface 906.

As mentioned above, custom block 904 may be accessible using interface 906. For example, in the event custom block 904 is reconfigurable and/or programmable, custom block 904 may be configured by a network device using interface 906 to generate one or more output signals tailored to the particular system modules M being tested or debugged. In addition or in the alternative, custom block 904 may be controlled by a remote host during system test or debug using interface 906. As a result, custom block 904 may be configured at runtime of a system level test or debug session.

FIG. 9 shows custom block 904 being separate from embedded logic analyzer 902 in integrated circuit 900. It is understood that, alternatively, custom block 904 may be located within embedded logic analyzer 902 in integrated circuit 900 and be coupled to interconnect module 210, trigger module 220 and memory controller 240 as described above.

Figure 10:
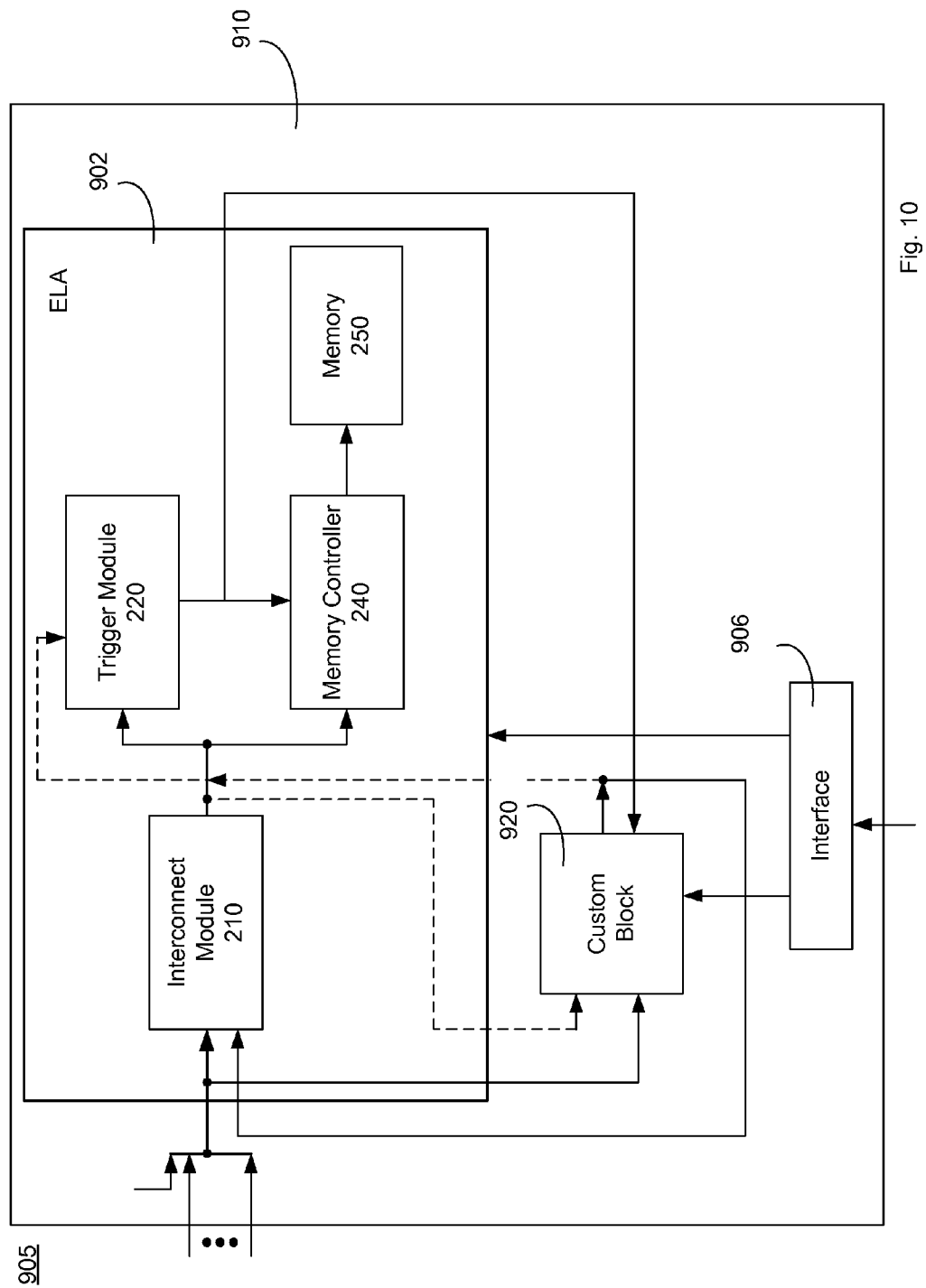
FIG. 10 is a block diagram illustrating a system having an integrated circuit according to an exemplary embodiment.

FIG. 10 illustrates an integrated circuit 910 of system 905 according to another exemplary embodiment of the present invention. Integrated circuit 910 may include embedded logic analyzer 902 as described above with respect to FIG. 9, having interconnect module 210, trigger module 220, memory controller 240 and memory 250. Integrated circuit 910 may also include a custom block 920 for generating one or more signals for sampling or event triggering by embedded logic analyzer 902, based upon signals provided to and/or generated within embedded logic analyzer 902.

Like custom block 904 in FIG. 9, custom block 920 is coupled to embedded logic analyzer 902 to receive as an input one or more signals provided to embedded logic analyzer 902. Custom block 920, like custom block 904, may generate one or more output signals based upon one or more received input signals which is provided to embedded logic analyzer 902, trigger module 220 (for event triggering) and/or memory controller 240 (for selective sampling). Similar to custom block 904, custom block 920 may include circuitry that is specific to the system modules M that are capable of being tested or debugged by embedded logic analyzer 902. In one embodiment, the functions performed by custom block 920 in generating one or more output signals may be configurable and/or programmable using FPGA or CPLD circuitry, a processor executing downloaded test/debug code, state machine circuitry, etc. Interface 906 may be coupled to custom block 920 for providing access thereto so that custom block may be controlled, configured and/or programmed using a network device, such as a host device.

Further, custom block 920 may receive as an input one or more signals generated by trigger module 220. In particular, one or more trigger signals generated by trigger module 220, which indicates the detection of at least one event, may be provided as an input to custom block 920. One or more output signals generated by custom block 920 may be based upon the one or more trigger signals generated by trigger module 220. In this way, an output signal generated by custom block 920 may be defined based upon signals generated by system modules M under test or debug as well as actions that are defined and executed at runtime of a test or debug session.

For example, a trigger signal generated by trigger module 220 of embedded logic analyzer 902 and provided to custom block 920 may be used to selectively enable signal generating circuitry within custom block 920. In one implementation, custom block 920 may be configured as an accumulator to count a number of events, such as the number of words read from memory by a direct memory access (DMA) system module. One testing or debugging of the system selects the DMA module to monitor, and controls, programs and/or configures trigger module 220 accordingly using interface 906. A trigger program by which trigger module 220 is configured may include an action to trigger accumulation. Upon detection of the condition of one or more signals provided to trigger module 220, a trigger signal generated by trigger module 220 indicates detection of the condition and enables the accumulator configured within custom block 920 to begin accumulating in synchronicity with a clock signal (not shown). Trigger module 220 may also, either via the same trigger signal used to enable the accumulator or a different trigger signal, disable the accumulator following its enablement. The signal used for disabling may be driven by circuitry that is configurable and/or programmable and detect the occurrence of at least one trigger event relating to one or more signals received by trigger module 220. Following disablement, the output of the accumulator may be provided to the input of embedded logic analyzer 902 for selective sampling by memory controller 240 or event triggering by trigger module 220. By controlling the accumulator function within custom block 920 to accumulate only upon the occurrence of a user specified trigger event and providing the accumulated result to embedded logic analyzer 902, substantially less memory is needed to store samples of the output of the accumulator function than would otherwise be necessary in order to count the number of words read by the DMA system module.

Figure 11:
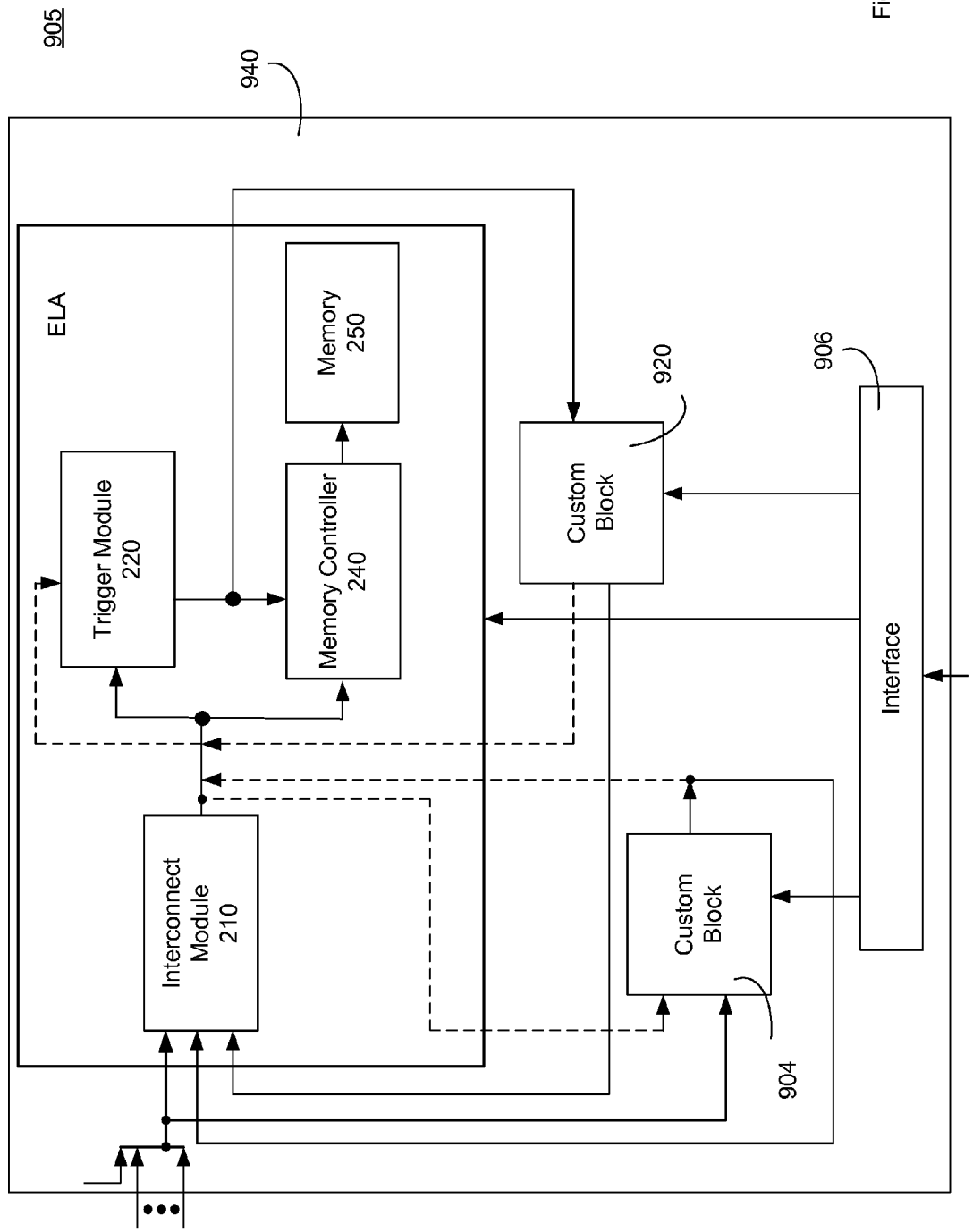
FIG. 11 is a block diagram illustrating a system having an integrated circuit according to an exemplary embodiment.

It is understood that custom blocks 904 and 920 may be utilized in the same integrated circuit chip. FIG. 11 illustrates such an integrated circuit 940 of system 905 according to an exemplary embodiment of the present invention, including both custom blocks 904 and 920.

It is understood that integrated circuits 900, 910 and 940 may be used in virtually any system which may benefit from an embedded mechanism to facilitate the efficient testing and debugging of the system and the system modules M thereof. For example, a printer, all-in-one printing device or multi-function printer may include integrated circuit 900.

Use of custom blocks 904 and 920 has been seen to substantially reduce the amount of memory necessary for storing signals sampled by embedded logic analyzer 902. For instance, a printer or other imaging device may include a serial interface for providing to the printer printhead print data for an entire print job, which may require gigabytes of storage. If it is desired to know the number of times a specific nozzle in the printhead fires, custom block 904 or 920 may be configured to receive the signal from the serial interface and generate a signal indicative of the particular nozzle firing, without any information relating to any other nozzle of the printhead. The generated signal may be provided as an input to embedded logic analyzer 902 for selectively sampling during a test/debug session. Sampling and storage in memory of the custom generated signal has been seen to occupy only kilobytes of memory, substantially less than the amount of memory needed to sample and store the entire serial interface.

Figure 12:
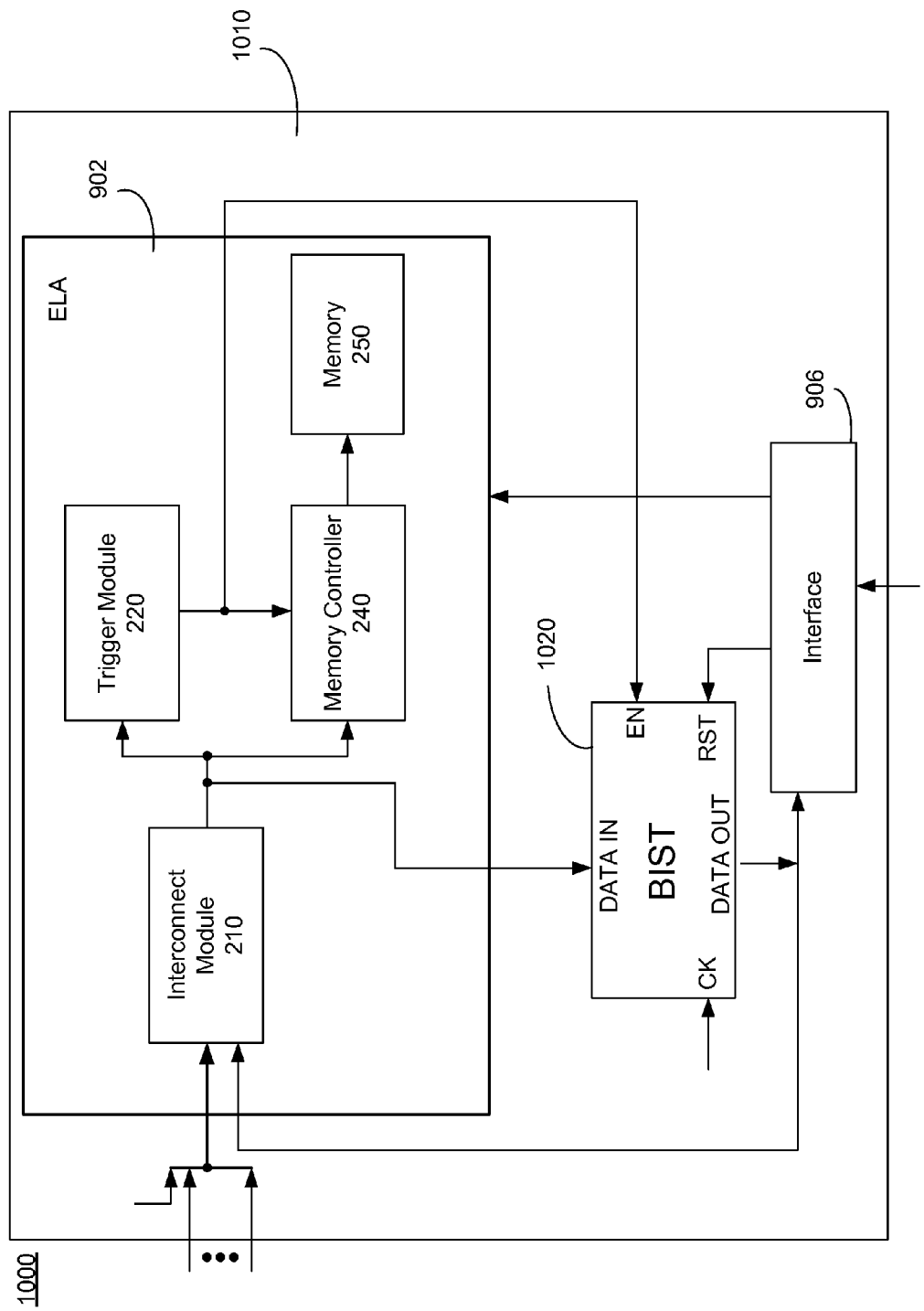
FIG. 12 is a block diagram illustrating a system having a BIST block associated with a logic analyzer according to another exemplary embodiment.

FIG. 12 is a block diagram of an integrated circuit 1010 in a system 1000 according to another embodiment. Integrated circuit 1010 may include embedded logic analyzer 902 having interconnect module 210, trigger module 220, memory controller 240 and memory 250 communicatively coupled together as described above. Embedded logic analyzer 902 may receive signals generated by system modules appearing in system 1000. Integrated circuit 1010 may further include built in self test (BIST) block 1020 coupled to embedded logic analyzer 902. In general terms, BIST block 1020 has stored therein a signature and creates a new signature by capturing a signal or set of signals at particular times as determined by the status of an enable input signal and clock signal. The new signature is thus based upon the previously stored signature as well as the signals captured. By capturing signals associated with embedded logic analyzer 902 numerous times throughout a test or debug procedure, for example, the signature stored in BIST block 1020 may indicate whether the system under test is performing correctly by simply comparing the stored signature to an expected value.

As shown in FIG. 12, BIST block 1020 may be coupled to embedded logic analyzer 902 for receiving as data inputs one or more signals received thereby. For example, a data input of BIST block 1020 may be coupled to one or more outputs of interconnect module 210 for receiving one or more signals thereat. BIST block 1020 may include an enable input for selectively enabling the capture of signals appearing at its data input and thereby creating a new signature. During the time the signal appearing at the enable input is asserted, signals appearing at the data input of BIST block 1020 are captured and a new signature is generated upon the occurrence of each triggering edge of the signal appearing at the clock input of the BIST block 1020. The enable input of BIST block 1020 may be coupled to an output of trigger module 220 for receiving at least one signal therefrom. In this way, upon the detection of at least one event by trigger module 220, BIST block 1020 captures a set of one or more signals appearing at its data input and thereby generates a new signature with each triggering edge of the received clock signal. The clock input of BIST block 1020 for controlling signal capture and new signature generation may be coupled to a system clock or a test clock used to synchronize operations within embedded logic analyzer 902, for example.

Following enabling of BIST block 1020, trigger module 220 may generate a signal that is provided to BIST block 1020 to disable it. In particular, the trigger module 220 may be configured or otherwise programmed to disable BIST block 1020 following its enablement. For instance, trigger module 220 may disable BIST block 1020 in response to the detection of a trigger event that is based upon one or more signals received by trigger module 220. The particulars of the trigger event may be configured or programmed at runtime of a test or debug session, like any other trigger event monitored by trigger module 220. The trigger event for disabling BIST block 1020, for example, may be based in part upon a predetermined period of time lapsing following its enablement, wherein the predetermined period of time is configured or otherwise programmed at runtime. It is understood, though that the trigger event may be based upon any of a number of functions or operations defined within trigger module 220 and upon one or more signals received thereby.

The stored signature of BIST block 1020 may be provided at the data output thereof, which may be coupled to embedded logic analyzer 902 for triggering an event or storing therein. For example, the data output of BIST block 1020 may be coupled to an input of embedded logic analyzer 902 so that the data output is applied to an input of interconnect module 210. In addition or in the alternative, the data output of BIST block 1020 may be directly coupled to an input of trigger module 220 and/or memory controller 240. As a result, the signature maintained in BIST block 1020 may be utilized by embedded logic analyzer 902 as any other signal associated therewith.

BIST block 1020 may be coupled to interface 906 for providing direct user access to the stored signature, as shown in FIG. 12. Interface 906 being coupled to BIST block 1020 may also allow for BIST block 1020 to be relatively easily placed in a predetermined state, as will be explained in greater detail below.

Figure 13:
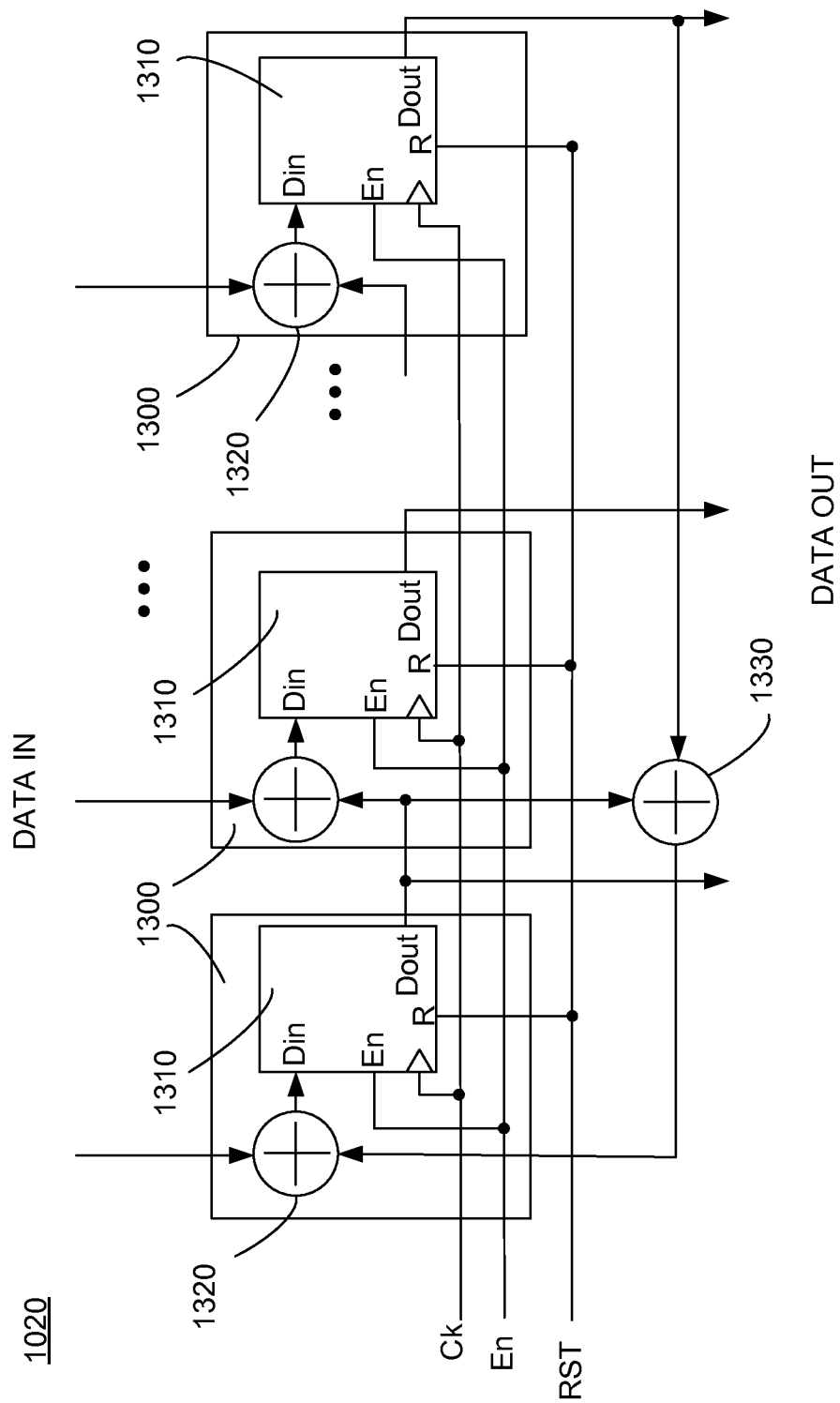
FIG. 13 is a block diagram of the BIST block of FIG. 12.

FIG. 13 illustrates one possible implementation of BIST block 1020. BIST block 1020 may include a number of serially connected bit slices 1300 which combine to serve as a linear feedback shift register. Specifically, each bit slice 1300 may include a latch, such as a D-type flip flop 1310, having a data input, a clock input, a reset input, a clock enable input and a data output. The clock input of each flip flop 1310 may be coupled together to the same input of BIST block 1020, and the clock enable of each flip flop 1310 may also be coupled together to the same input of BIST block 1020, as shown in FIG. 13. As a result, flip flops 1310 of BIST block 1020 may be clocked and enabled by the same signals.

Each bit slice 1300 may further include at least one logic gate 1320, such as an exclusive OR logic gate, having a first input coupled to a data input of BIST block 1020, a second input and an output which is coupled to the data input of flip flop 1310. The data output of a flip flop 1310 may be coupled to the input of the next flip flop 1310 in the serial shift register chain via the second input of the logic gate 1320 in the next flip flop 1310, as shown in FIG. 13. Further, the second input of the logic gate 1320 in the first and/or most upstream bit slice 1300 in the serial shift register chain may be coupled to one or more data outputs of flip flops 1310 of bit slices 1300 in the serial shift register chain via logic gate (exclusive OR gate) 1330. The data output of each flip flop 1310 of bit slices 1300 may be coupled to the data output of BIST block 1020.

It is desirable to place flip flops 1310 in a known, predetermined state at the beginning of a test or debug session, for example. Accordingly, BIST block 1020 may include a reset input which is coupled to the reset input of each flip flop 1310, the assertion of which places flip flops 1310 in a predetermined or reset state. It is understood that flip flops 1310 may all have the same Boolean state as the predetermined or reset state, or that some flip flops 1310 may have a first Boolean state as the predetermined state while other flip flops 1310 may have a second Boolean state as the predetermined state. The reset input of BIST block 1020 may be coupled to interface 906 so that flip flops 1310 may be relatively easily placed in the predetermined state.

It is understood that BIST block 1020, and more particularly bit slices 1300, may be implemented in any number of ways while still performing as a linear feedback shift register or the like to create a signature based upon a previously maintained signature and upon signals captured upon the occurrence of each triggering edge of a clock signal.

Figure 14:
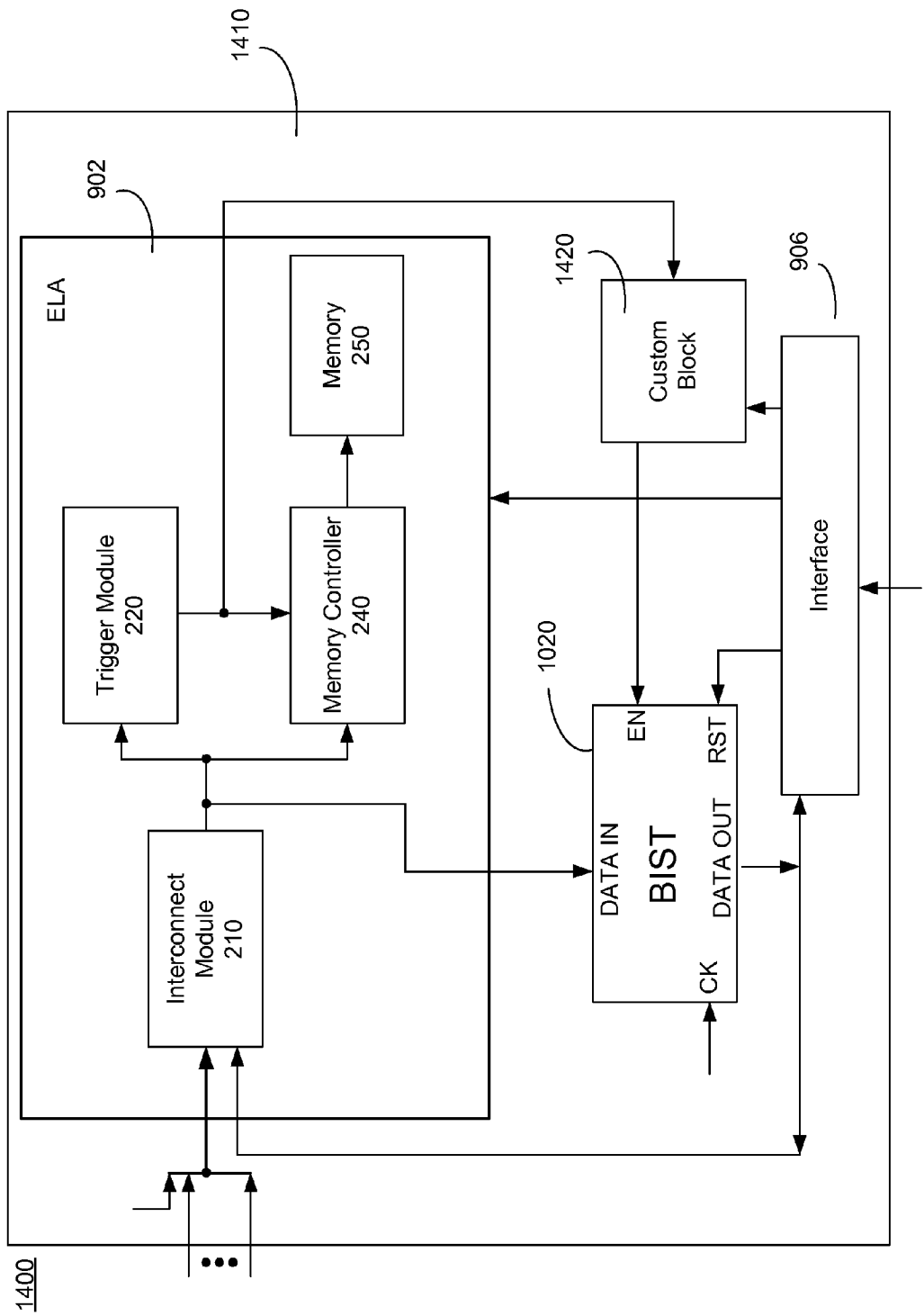
FIG. 14 is a block diagram of a system including an integrated circuit having a BIST block associated with a logic analyzer according to another exemplary embodiment.

FIG. 14 is a block diagram of system 1400 according to another embodiment. System 1400 may include integrated circuit 1410 having embedded logic analyzer 902 which may include interconnect module 210, trigger module 220, memory controller 240 and memory 250 as described above, and receive signals from various system modules for test or debug. In addition, integrated circuit 1410 may include BIST block 1020 as described above with respect to FIG. 13, having a data input and a data output coupled to embedded logic analyzer 902 as well as an enable input. Interface 906 may be coupled to embedded logic analyzer 902 and BIST block 1020 for providing user access thereto. In addition, integrated circuit 1410 may include a custom block 1420.

Custom block 1420 may be connected between trigger module 220 of embedded logic analyzer 902 and BIST block 1020. In particular, custom block 1420 may include an input coupled to at least one output of trigger module 220, and an output coupled to the enable input of BIST block 1020. Custom block 1420 may generate at least one signal at its output which is based upon the detection of at least one triggering event by trigger module 220.

Similar to custom block 920, custom block 1420 may include circuitry that is specific to the system modules M that are capable of being tested or debugged by embedded logic analyzer 902. In one embodiment, the functions performed by custom block 1420 in generating one or more output signals may be configurable and/or programmable using FPGA or CPLD circuitry, a processor executing downloaded test/debug code, state machine circuitry, etc. Interface 906 may be coupled to custom block 1420 for providing access thereto so that custom block 1420 may be controlled, configured and/or programmed using a network device, such as a host device.

As mentioned, custom block 1420 may receive as an input one or more signals generated by trigger module 220. In particular, one or more trigger signals generated by trigger module 220, which indicates the detection of at least one event, may be provided as an input to custom block 1420. One or more output signals generated by custom block 1420 and provided to BIST block 1020 thus may be based upon the one or more trigger signals generated by trigger module 220 as well as the functions that are configured and/or programmed in custom block 1420. In this way, an output signal generated by custom block 1420 which selectively enables BIST block 1020 may be defined based upon signals generated by system modules M under test or debug as well as actions and functions that are defined and executed at runtime of a test or debug session.

The one or more output signals generated by custom block 1420 that enables BIST block 1020 may also serve to disable BIST block 1020. Such one or more signals may disable BIST block 1020 based upon the detection of one or more trigger events by trigger module 220 and/or upon a predetermined function defined in custom block 1420. The predetermined function, which may be configured or otherwise programmed at runtime of a test or debug session, may include a timer function which disables BIST block 1020 a predetermined period of time following its enablement. It is understood, though, that the signal which disables BIST block 1020 may be based in part upon virtually any predetermined function defined in custom block 1420.

Figure 15:
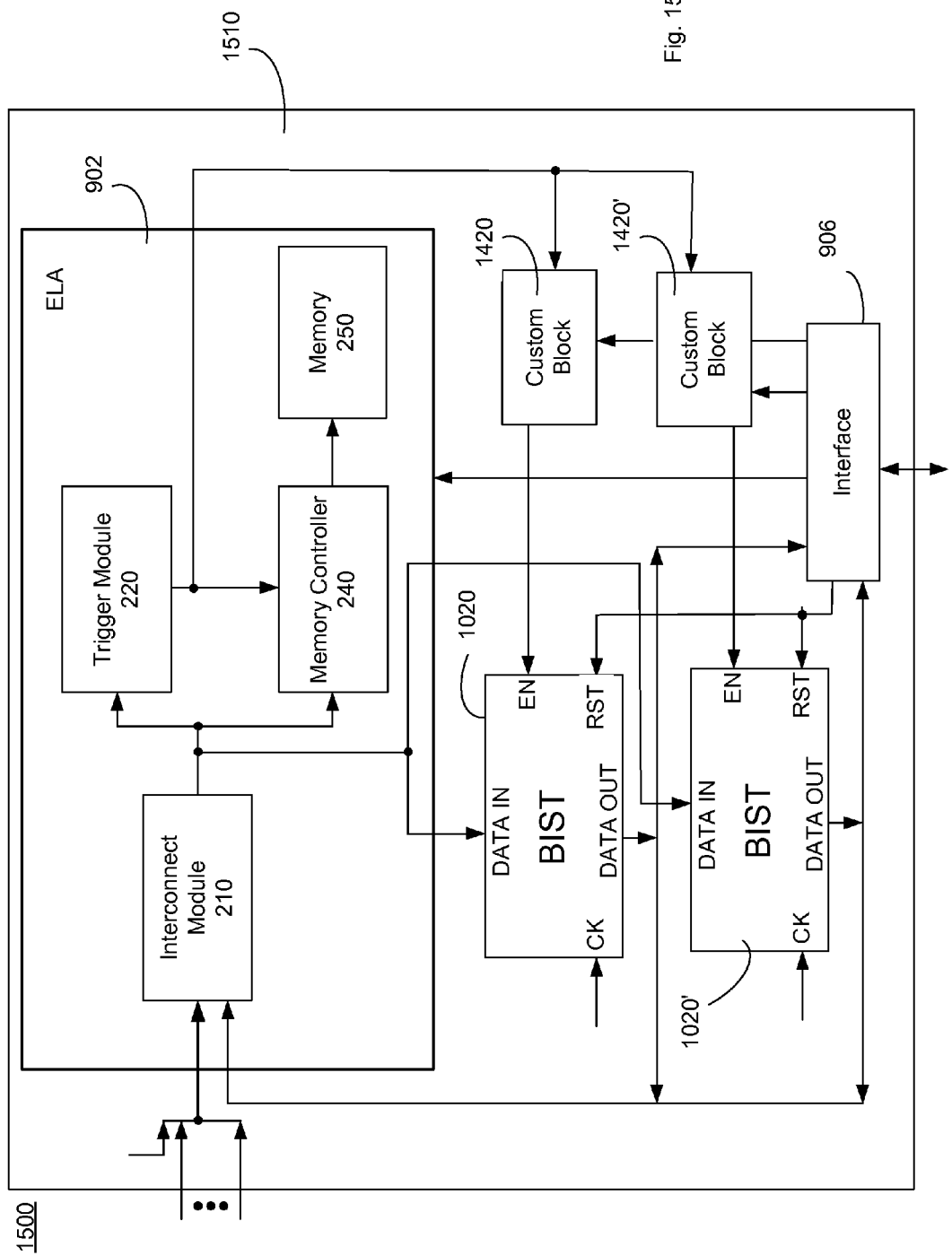
FIG. 15 is a block diagram of a system including an integrated circuit having a BIST block associated with a logic analyzer according to another exemplary embodiment.

It is further understood that integrated circuits 1010 and 1410 may include more than one BIST block 1020 so that multiple signatures may be separately maintained and generated during a test or debug session. FIG. 15 illustrates a system 1500 having integrated circuit 1510 which includes multiple BIST blocks 1020 and 1020', each of which receives one or more signals from embedded logic analyzer 902. In particular, each BIST block 1020, 1020' may receive a distinct set of one or more signals from or associated with embedded logic analyzer 902, such as signals appearing at the output of interconnect module 210. The output of each BIST block 1020, 1020' may be coupled to embedded logic analyzer 902 for sampling or storing therein. For example, the data output of each BIST block 1020, 1020' may be coupled to an input of embedded logic analyzer 902, as shown in FIG. 15.

Each BIST block 1020, 1020' may be separately enabled and disabled for signature generation. In particular, the enable/disable input of each BIST block 1020 and 1020' may be coupled to the output of a distinct custom block 1420 and 1420', respectively. Each custom block 1420, 1420' may receive at an input thereof one or more signals from trigger module 220. The one or more signals received from trigger module 220 by each custom block 1420, 1420' may be distinct relative to the one or more signals received by the other custom block 1420, 1420'. In addition, each custom block 1420, 1420' may be separately programmed and/or configured by a host device using interface 906. As a result, custom blocks 1420 and 1420' may be capable of separately and independently enabling and disabling its corresponding BIST block 1020 and 1020', respectively. It is understood that system 1500 may include more than two BIST blocks 1020 and 1020' depending upon the system modules M to be tested and debugged.

Figure 16A:
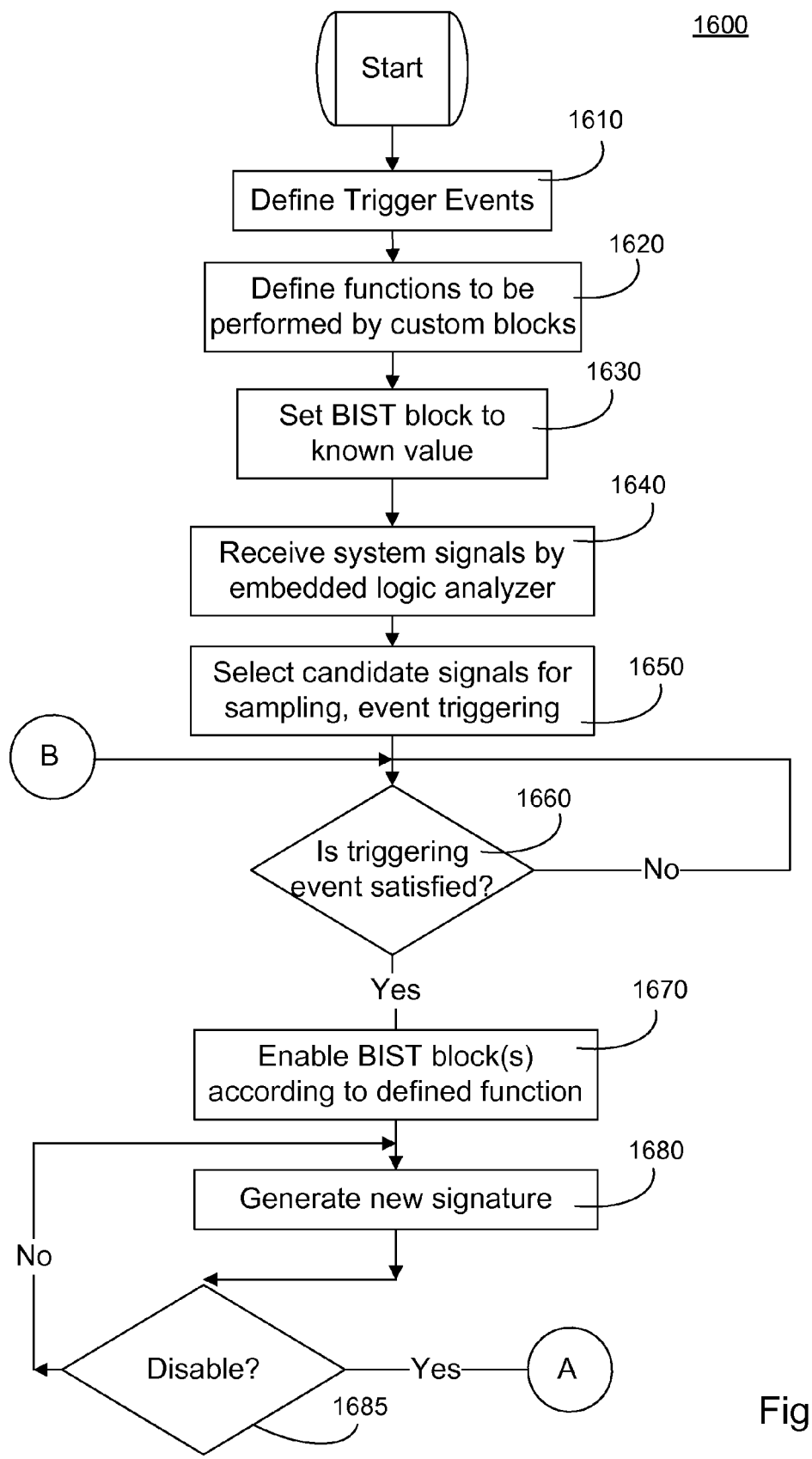
FIGS. 16a and 16b are a flowchart illustrating the operation of a system of FIGS. 12, 14 and 15.
Figure 16B:
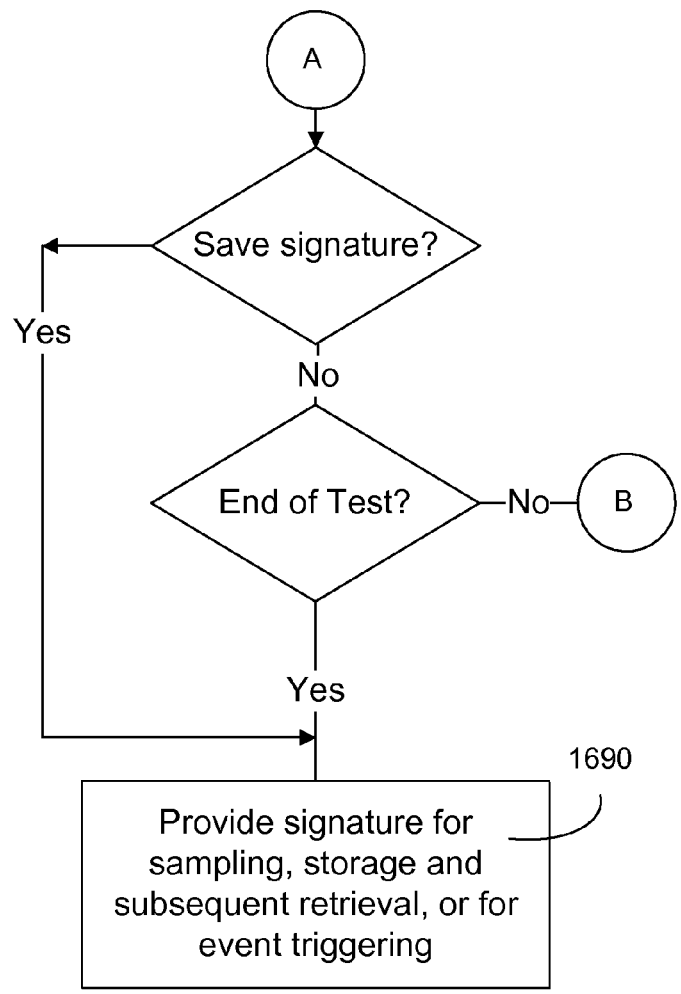

The operation of systems 1400 and 1500 will be described with reference to FIGS. 16a and 16b. At runtime of a test or debug session, trigger events are defined at 1610 for configuring the trigger events that trigger module 200 is to detect during the session. At around the same time, the functions performed by custom blocks 1420 and 1420' are defined at 1620 so that custom blocks 1420 and 1420' generate enable signals for BIST blocks 1020 and 1020', respectively, according to desired functions that may be based upon the particular system modules M being tested or debugged. This may be accomplished by programming programmable circuitry in custom blocks 1420 and 1420'. In the event custom blocks 1420 and 1420' include a processor, this defining may be accomplished by loading code into memory that is accessible by the processor for execution. It is understood that defining the functions to be performed by custom blocks 1420 and 1420' depends upon the particular implementations of such blocks.

Also at runtime, each of BIST blocks 1020 and 1020' may be placed in its known, predetermined state at 1630 using interface 906. Next, during the system test or debug session, at 1640 embedded logic analyzer 902 may receive signals from one or more system modules M. During this time, embedded logic analyzer 902 may select at 1650 certain signals from the received signals as candidate signals. This selection may be performed by interconnect module 210. One or more of the selected candidate signals may be used by trigger module 220 for detecting for the occurrence of a previously defined trigger event, while other candidate signals may be available for signal capture in response to such detection.

Next, a determination may be made at 1660 by trigger module 220 whether one or more previously defined trigger events have occurred. Upon an affirmative determination that a trigger event has occurred, one or more candidate signals may be captured by memory controller 240 and stored in memory 250. In addition or in the alternative, the detection of a trigger event by trigger module 220 may cause, at least in part, at least one of custom blocks 1420 and 1420' to generate an enable signal at 1670 for enabling a corresponding BIST block 1020 and 1020', respectively, depending upon the function previously defined at 1620. In the event a custom block 1420 enables its corresponding BIST block 1020 at least partly in response to the detection of a trigger event, a new signature is generated at 1680 at each clock pulse based upon the previously maintained signature and upon the signals appearing at the data input of BIST block 1020.

At some point in the test or debug session following detection of a trigger event at 1660, another trigger event may occur at 1685 to disable the previously enabled BIST block 1020. This trigger event may be detected, for example, by trigger module 220 based upon one or more of the candidate signals selected at 1650. Alternatively, such trigger event may be based upon the lapse of a predetermined period of time following the enablement of BIST block 1020 or following the detection of the trigger event in 1660, as monitored by trigger module 220 or custom block 1420. Upon the detection of the trigger event at 1685, BIST block 1020 may be disabled which thereby inhibits further signature generation. At this point, the signature generated by BIST block 1020 may be provided to embedded logic analyzer 902 at 1690 for sampling and storage or for event triggering therein. The signature may also be provided over interface 906 for analysis.

If the test or debug session is not complete, operation may resume at 1660 for determining whether another trigger event has occurred, or at 1650 for selecting another group of signals to serve as candidate signals.

The generated signature may be provided at 1690 to embedded logic analyzer 902 for initiating a trigger event or for signal capture by memory controller 240 for storage in memory 250. This may occur following BIST block 1020 no longer being enabled. In the event the generated signature is captured and stored in memory 250, the signature may be thereafter retrieved for analysis. Such analysis may include comparing the retrieved signature to an expected signature value identified through system simulation, and determining that the system is operating correctly if the retrieved signature matches the expected signature value.

It is understood that any one or more of BIST blocks 1020 and 1020' and custom blocks 1420 and 1420' may be included within logic analyzer 902. It is further understood that integrated circuits 1010, 1410 and 1510 may be used in virtually any system which may benefit from an embedded mechanism to facilitate the efficient testing and debugging of the system and the system modules M thereof. For example, a printer, all-in-one printing device or multifunction printer may include integrated circuit 900.

A mechanism for testing and debugging a system may include, in addition to custom blocks 904 and 920, software to communicate with embedded logic analyzer 902 and custom blocks 904 and 920. The software provides the user with the ability to select in-system options for such blocks and control or otherwise program them after the system has been synthesized and/or assembled, such as at runtime of a system test or debug session. The software, including a user interface, provides communication with embedded logic analyzer 902 and blocks 904 and 920 via interface 906. The software may be used to receive at a remote device the data sampled and stored by embedded logic analyzer 902 and display the signals to the remote device user.

It will be apparent to those skilled in the art that various modifications and variations can be made to the present invention without departing from the spirit and scope of the invention. For example, it is understood that the embedded logic analyzer 902 may include an output module 230 and controller 270 found in embedded logic analyzer 200 of FIG. 2. In addition or in the alternative, integrated circuit 900, 910 and 940 may include a CPU 500 and storage medium 510 coupled to embedded logic analyzer 902 as shown in FIGS. 5 and 6. Integrated circuits 900, 910 and 940 may also include a processor 710 coupled to trigger module 220 as shown in FIG. 7. Thus it is intended that the present invention cover the modifications and variations of this invention provided they come within the scope of the appended claims and their equivalents.

The invention claimed is:

1. An apparatus, comprising:
   an integrated circuit, comprising:
      a logic analyzer having a first input receiving a plurality of signals from one or more portions of the apparatus under test and an output for providing an indication of a detection, by the logic analyzer, of at least one trigger event; and
      a built in self test (BIST) block having a first input for receiving one or more of the signals appearing at the first input of the logic analyzer, and a second input coupled to the output of the logic analyzer for selectively enabling the BIST block, the BIST block generating and maintaining a signature based upon the first and second inputs thereof.

2. The apparatus of claim 1, wherein the BIST block includes an output for providing the maintained signature, the output of the BIST block being coupled to the logic analyzer for sampling or storage therein.

3. The apparatus of claim 1, wherein the logic analyzer includes a multiplexer block having an input coupled to the first input of the logic analyzer, and the first input of the BIST block is coupled to an output of the multiplexer block.

4. The apparatus of claim 1, wherein the logic analyzer comprises a multiplexer block having an input coupled to the first input of the logic analyzer and a memory controller block having a first input coupled to an output of the multiplexer block and a second input coupled to the output of the BIST block.

5. The apparatus of claim 1, wherein the BIST block comprises a multiple input shift register, and the signature maintained in the BIST block is maintained in the multiple input shift register.

6. The apparatus of claim 1, wherein the BIST block includes a clock input such that when the BIST block is enabled by the logic analyzer, the BIST block generates a new signature upon each occurrence of a triggering edge of a signal appearing at the clock input of the BIST block.

7. The apparatus of claim 1, further comprising an action block having an input coupled to the logic analyzer to receive the indication of the detection of the at least one trigger event, and an output coupled to the second input of the BIST block, the action block generating at the output thereof a signal that is based upon the input of the action block according to a predetermined function, the predetermined function being configurable.

8. The apparatus of claim 1, further comprising a plurality of BIST blocks, each BIST block having a first input for receiving one or more signals associated with the logic analyzer, a second input coupled to the logic analyzer for enabling the BIST block, and an output coupled to the logic analyzer, wherein each BIST block separately and independently generates and maintains a signature based in part upon the first and second inputs thereof.

9. The apparatus of claim 1, wherein the logic analyzer samples one or more of the plurality of signals appearing at the first input thereof from the one or more portions of the apparatus under test during a test or debug operation as the BIST block generates the signature.

10. An integrated circuit, comprising:
    a logic analyzer having a first input for receiving a plurality of signals from a system under test and a first output for providing selected samples of the signals appearing at the first input; and
    a signature generator having a first input coupled to the logic analyzer for receiving one or more of the signals appearing at the first input thereof and an output coupled to the logic analyzer providing a signature via the output of the signature generator to the logic analyzer, the logic analyzer sampling one or more of the plurality of signals appearing at the first input thereof from the system under test during a test or debug operation as the signature generator generates a new signature.

11. The integrated circuit of claim 10, wherein the logic analyzer generates an event signal indicating a detection of an event monitored by the logic analyzer, the signature generator includes an enable input for enabling the signature generator to generate the new signature, and the event signal is coupled to the enable input of the signature generator.

12. The integrated circuit of claim 11, further comprising an action block having an input coupled to the logic analyzer to receive the event signal, and an output signal coupled to the enable input of the signature generator, the action block generating the output signal based at least in part upon the input signal thereof according to a predetermined function.

13. The integrated circuit of claim 12, wherein the predetermined function is programmable.

14. The integrated circuit of claim 10, wherein the logic analyzer includes a multiplexer circuit having an input coupled to the first input of the logic analyzer and a memory control circuit having a first input coupled to an output of the multiplexer circuit and a second input coupled to the signature generator for receiving the signature therefrom.

15. The integrated circuit of claim 10, wherein the signature generator receives a clock signal and, when enabled, generates a new signature responsive to each triggering edge of the clock signal.

16. The integrated circuit of claim 11, wherein the signature generator is selectively enabled by the logic analyzer.

17. A system, comprising:

one or more system modules; and an integrated circuit, comprising:

an embedded logic analyzer block having an input for receiving a plurality of signals from the one or more system modules; and a test block having an input coupled to the embedded logic analyzer block for receiving at least one of the plurality of signals from the one or more system modules, the test block maintaining a signature value therein, the test block selectively generating and maintaining a new signature when enabled based upon the maintained signature and upon the input of the test block, the embedded logic analyzer block sampling and storing one or more of the signals appearing at the input thereof from the one or more system modules while the test block generates at least one new signature.

18. The system of claim 17, wherein the test block includes an output coupled to the embedded logic analyzer block for providing the new signature thereto.

19. The system of claim 17, wherein the test block is enabled and disabled based at least in part by the embedded logic analyzer.

20. The system of claim 17, further comprising a custom block generating at least one output signal according to at least one predetermined function, wherein the test block is enabled and disabled based at least in part by the at least one predetermined function, the at least one predetermined function being programmable.

21. The system of claim 17, wherein the embedded logic analyzer includes an output for providing an indication of a detection of at least one trigger event, and the test block includes an enable input coupled to the output of the embedded logic analyzer, the test block being selectively enabled to generate and maintain the new signature based upon the indication received at the enable input thereof.

* * * * *